United States Patent [19]
Kadosh et al.

[11] Patent Number: 5,909,622
[45] Date of Patent: Jun. 1, 1999

[54] ASYMMETRICAL P-CHANNEL TRANSISTOR FORMED BY NITRIDED OXIDE AND LARGE TILT ANGLE LDD IMPLANT

[75] Inventors: Daniel Kadosh, Austin; Mark I. Gardner, Cedar Creek, both of Tex.

[73] Assignee: Advanced Micro Devices, Inc.

[21] Appl. No.: 08/720,732

[22] Filed: Oct. 1, 1996

[51] Int. Cl.[6] .................................................. H01L 21/336
[52] U.S. Cl. ........................... 438/286; 438/302; 438/305
[58] Field of Search ................................... 438/286, 302, 438/303, 305, 306, 307, FOR 175, FOR 190

[56] References Cited

U.S. PATENT DOCUMENTS

| | | | |
|---|---|---|---|
| 4,272,881 | 6/1981 | Angle | 438/284 |
| 4,621,277 | 11/1986 | Ito et al. | 148/DIG. 112 |
| 4,855,247 | 8/1989 | Ma et al. | 148/DIG. 105 |
| 4,914,046 | 4/1990 | Tobin | 438/592 |
| 4,962,054 | 10/1990 | Shikata | 438/179 |
| 5,015,598 | 5/1991 | Verhaar | 438/596 |
| 5,066,604 | 11/1991 | Chung et al. | 438/229 |
| 5,200,358 | 4/1993 | Bollinger et al. | 437/180 |
| 5,286,664 | 2/1994 | Horiuchi | 438/286 |
| 5,296,398 | 3/1994 | Noda | 438/179 |
| 5,393,676 | 2/1995 | Anjum et al. | 438/301 |
| 5,397,715 | 3/1995 | Miller | 438/268 |
| 5,525,552 | 6/1996 | Huang | 438/297 |
| 5,532,176 | 7/1996 | Katada et al. | 438/302 |
| 5,547,885 | 8/1996 | Ogoh | 438/286 |
| 5,656,518 | 8/1997 | Gardner et al. | 438/286 |
| 5,679,592 | 10/1997 | Kang | 437/44 |
| 5,744,371 | 4/1998 | Kadosh et al. | 438/286 |
| 5,783,458 | 7/1998 | Kadosh et al. | 437/44 |

FOREIGN PATENT DOCUMENTS

| | | |
|---|---|---|
| 575099 | 12/1993 | European Pat. Off. . |
| 3939319 | 5/1990 | Germany . |
| 63-78574 | 4/1988 | Japan . |
| 3-198349 | 8/1991 | Japan . |
| 07-326736 | 12/1995 | Japan . |
| 7-326736 | 12/1995 | Japan ............................ 438/FOR 190 |

OTHER PUBLICATIONS

Horiuchi et al., "An Asymmetric Sidewall Process for High Performance LDD MOSFET's," IEEE Transactions on Electron Devices, vol. 41, No. 2, Feb. 1994, pp. 186–190.

*Primary Examiner*—Michael Trinh
*Attorney, Agent, or Firm*—Kevin L. Daffer; Robert C. Kowert; Conley, Rose & Tayon

[57] ABSTRACT

Various processes are provided for producing a p-channel and/or n-channel transistor. The present processes are thereby applicable to NMOS, PMOS or CMOS integrated circuits, any of which derive a benefit from having an asymmetrical LDD structure. The asymmetrical structure can be produced on a p-channel or n-channel transistor in various ways. According, the present process employs various techniques to form an asymmetrical transistor. The various techniques employ processing steps which vary depending upon the LDD result desired. First, the LDD implant can be performed only in the drain-side of the channel, or in the drain-side as well as the source-side. Second, the gate conductor sidewall surface adjacent the drain can be made thicker than the sidewall surface adjacent the source. Thickening of the drain-side sidewall spacer can be achieved either by depositing oxide upon a nitride-bearing film, or by growing additional oxide upon an exposed silicon surface having the source-side sidewall protected from growth. Third, the drain-side can be enhanced relative to the source-side by using an LTA implant. There may be numerous other modifications and alternative processing steps, all of which are described herein. Regardless of the sequence chosen, a barrier implant may be employed to prevent deleterious ingress of p-type implant species into the channel region. The present fabrication sequence reduces source-side resistance to enhance drive current—a desirable outcome for high speed circuits.

8 Claims, 9 Drawing Sheets

ASYMMETRICAL P-CHANNEL TRANSISTOR FORMED BY NITRIDED OXIDE AND LARGE TILT ANGLE LDD IMPLANT

BACKGROUND OF THE INVENTION

1. Field of the Invention

This invention relates to the manufacture of an integrated circuit and more particularly to the formation of an n-channel and/or p-channel asymmetrical transistor.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and gate oxide are then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

The gate conductor and adjacent source/drain regions are formed using well known photolithography techniques. Gate conductors and source/drain regions arise in openings formed through a thick layer of what is commonly referred to as field oxide. Those openings and the transistors formed therein are termed active regions. The active regions are therefore regions between field oxide regions. Metal interconnect is routed over the field oxide to couple with the polysilicon gate conductor as well as with the source/drain regions to complete the formation of an overall circuit structure.

Integrated circuits utilize either n-channel devices exclusively, p-channel devices exclusively, or a combination of both on a unitary monolithic substrate. While both types of devices can be formed, the devices are distinguishable based on the source/drain impurity dopant. The method by which n-type dopant is used to form an n-channel device and p-type dopant is used to form a p-channel device entails unique problems associated with each device. As layout densities increase, the problems are exacerbated. Device failure can occur unless adjustments are made to processing parameters and processing steps. N-channel processing must, in most instances, be dissimilar from p-channel processing due to the unique problems of each type of device. Problems inherent in n-channel fabrication will be discussed first followed by p-channel second.

N-channel devices are particularly sensitive to so-called short-channel effects ("SCE"). The distance between source and drain regions is often referred to as the physical channel length. However, after implantation and subsequent diffusion of the source and drains, distance between the source and drains regions become less than the physical channel length and is often referred to as the effective channel length ("Leff"). In VLSI designs, as the physical channel becomes small, so too must the Leff. SCE becomes a predominant problem whenever Leff drops below approximately 2.0 μm.

Generally speaking, SCE impacts device operation by, inter alia, reducing device threshold voltages and increasing sub-threshold currents. As Leff becomes quite small, the depletion regions associated with the source and drain areas may extend toward one another and substantially occupy the channel area. Hence, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold amount, current between the source and drain nonetheless exist for transistors having a relatively short Leff.

Two of the primary causes of increased sub-threshold current are: (i) punch through and (ii) drain-induced barrier lowering ("DIBL"). Punch through results from the widening of the drain depletion region when a reverse-bias voltage is applied across the drain-well diode. The electric field of the drain may eventually penetrate to the source area, thereby reducing the potential energy barrier of the source-to-body junction. Punch through current is therefore associated within the substrate bulk material, well below the substrate surface. Contrary to punch through current, DIBL-induced current occurs mostly at the substrate surface. Application of a drain voltage can cause the surface potential to be lowered, resulting in a lowered potential energy barrier at the surface and causing the sub-threshold current in the channel near the silicon-silicon dioxide interface to be increased. One method in which to control SCE is to increase the dopant concentration within the body of the device. Unfortunately, increasing dopant within the body deleteriously increases potential gradients in the ensuing device.

Increasing the potential gradients produces an additional effect known as hot-carrier effect ("HCI"). HCI is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel.

Using the n-channel example, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the roles of holes and electrons are reversed.

HCI occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is known that since hot electrons are more mobile than hot holes, HCI causes a greater threshold skew in n-channel devices than p-channel devices. Nonetheless, a p-channel device will undergo negative threshold skew if its Leff is less than, e.g., 0.8 μm.

Unless modifications are made to the transistor structure, problems of sub-threshold current and threshold shift resulting from SCE and HCI will remain. To overcome these problems, alternative drain structures such as double-diffused drains (DDDs) and lightly doped drains (LDDs) must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the gate electrode followed by a heavier dopant self-aligned to the gate electrode on which two sidewall spacers have been formed. The purpose of the first implant dose is to produce a lightly doped section of both the source and drain areas at the gate edge near the channel. The second implant dose is spaced from the channel a distance dictated by the thickness of the sidewall spacer. Resulting from the first and second implants, a dopant gradient occurs at the junction between the source and channel as well as the junction between the drain and channel.

A properly defined LDD structure must be one which minimizes HCI but not at the expense of excessive source/drain resistance. The addition of an LDD implant adjacent the channel unfortunately adds resistance to the source/drain path. This added resistance, generally known as parasitic resistance, can have many deleterious effects. First, parasitic resistance can decrease the saturation current (i.e., current above threshold). Second, parasitic resistance can decrease the overall speed of the transistor.

The deleterious effects of decreasing saturation current and transistor speed is best explained in reference to a transistor having a source resistance and a drain resistance. The source and drain parasitic resistances are compounded by the presence of the conventional source and drain LDDs. Using a n-channel example, the drain resistance $R_D$ causes the gate edge near the drain to "see" a voltage less than VDD, to which the drain is typically connected. Similarly, the source resistance $R_S$ causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT}=K/2*(V_{GS}-V_T)^2$$

where $I_{DSAT}$ is saturation current, K is a value derived as a function of the process parameters used in producing the transistor, and $V_T$ is the threshold voltage. Reducing or eliminating $R_S$ would therefore draw the source voltage closer to ground, and thereby increase the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, substantial LDD is required in the drain area. It would therefore seem beneficial to decrease $R_S$ rather than $R_D$. This implies the need for a process for decreasing $R_S$ (source-side LDD area) while maintaining $R_D$ (drain-side LDD area).

Proper LDD design must take into account the need for minimizing parasitic resistance $R_S$ at the source side while at the same time attenuating Em at the drain-side of the channel. Further, proper LDD design requires that the injection position associated with the maximum electric field Em be located under the gate conductor edge, preferably well below the silicon surface. It is therefore desirable to derive an LDD design which can achieve the aforesaid benefits while still properly placing and diffusing Em. This mandates that the channel-side lateral edge of the LDD area be well below the edge of the gate. Regardless of the LDD structure chosen, the ensuing transistor must be one which is not prone to excessive sub-threshold currents, even when the Leff is less than, e.g., 2.0 µm.

A properly designed LDD-embodied transistor which overcomes the above problems must therefore be applicable to either an n-channel transistor or a p-channel transistor. That transistor must be one which is readily fabricated within existing process technologies. In accordance with many modern fabrication techniques, it would be desirable that the improved transistor be formed having a net impurity concentration within the polysilicon gate of the same type as the LDD implant area and/or source/drain area.

SUMMARY OF THE INVENTION

The problems outlined above are in large part solved by an improved transistor configuration. The transistor can be either a p-channel or n-channel transistor. The transistor hereof is classified as an asymmetrical transistor, wherein the drain-side LDD implant adjacent the channel is purposefully made larger in lateral area than the source-side LDD implant.

There are various mechanisms used henceforth to achieve the asymmetrical configuration either on a p-channel or n-channel transistor. Regardless of the processing steps used, the result is a transistor having an LDD implant primarily or exclusively in only the critical region defined as the junction between the drain and the channel. Proper LDD design is achieved by incorporating a relatively large lateral area LDD implant at the drain-side of the channel while minimizing if not eliminating LDD implant at the source-side of the channel.

LDD implant focused primarily at the drain side maintains parasitic resistance of the drain LDD (i.e., $R_D$) but reduces if not eliminates parasitic resistance $R_S$ associated with the source-side LDD implant. Thus, the drain-engineered structure hereof serves to attenuate the maximum electric field Em in the critical drain area while reducing parasitic resistance $R_S$ in the source area. The drain-side LDD region is bounded by a junction which exists below the gate edge and far below the silicon surface. The LDD area, however, is attributed solely or primarily to the critical area near the drain. Shifting of the electric field, Em, occurs only in the region where shifting is necessary, i.e., only in the drain-side of the channel.

The p- or n-channel transistor formed as a result of the present LDD design receives the benefit of reduced HCI but not at the expense of performance (i.e., switching speed or saturation current). Even when Leff is less than 2.0 µm, where SCE would normally be a problem, the present LDD-embodied transistors experiences minimal sub-threshold currents. The present transistor advantageously employs a net p- or n-type dopant in the polysilicon gate which matches the dopant within the source and drain areas. By utilizing similar dopant within polysilicon as that used in the LDD and source/drain, the present process can be more readily incorporated into existing process flows.

Equally important in the present process is a step used to prevent boron penetration problems. Boron placed into the polysilicon can migrate into the underlying gate oxide and channel causing gate oxide degradation and threshold skews. A barrier implant using nitrogen ions is employed to prevent deleterious migration of those boron atoms from the polysilicon gate.

Broadly speaking, the present invention contemplates multiple processes for forming an asymmetrical NMOS or PMOS transistor. Regardless of the process chosen, the transistor being produced is one having a larger LDD implant area on the drain-side of the channel than on the source-side of the channel. In some instances, it may be necessary to completely eliminate LDD implant in the source side if parasitic resistance is a problem. Accordingly, the present invention contemplates at least seven possible embodiments used in producing the aforesaid transistors.

According to a first embodiment, a method is provided for producing an n-channel transistor. The method comprises providing a silicon substrate having a source region and a drain region laterally spaced from each other by a gate conductor. A first n-type dopant is implanted into the source region and the drain region, and the gate conductor. An opening is then formed through a layer of nitride deposited across the gate conductor, source and drain to expose only the drain region and a sidewall surface of the gate conductor adjacent the drain region. A drain-side spacer oxide is then grown upon the exposed drain region and the sidewall surface. The layer of nitride is then entirely removed, and a second n-type dopant is implanted into the source region as well as the drain region to complete formation of the n-channel resistor. The first embodiment thereby demonstrates the first n-type dopant (LDD) implant in both the source and drain. The drain-side implant of the second n-type dopant (source/drain) implant is spaced further from the drain-side edge of the LDD implant than the source-side implant is from the source-side edge. This is due to the thicker drain-side spacer oxide grown on the sidewall surface adjacent the drain area.

According to a second embodiment, a method of forming an n-channel transistor is provided, wherein the n-channel transistor is formed having a first n-type (LDD) implant only in the drain region. The method comprises presenting a silicon substrate having a source region and a drain region laterally spaced from each other by a gate conductor. A layer of nitride is deposited across the drain region, the source region and the gate conductor. An opening is formed through the layer of nitride to expose only the drain region and a sidewall surface of the gate conductor adjacent the gate region. A first n-type dopant is implanted through the opening exclusively into the exposed drain region. Thereafter a drain-side spacer oxide is grown upon the exposed drain region and the sidewall surface. The layer of nitride is then removed, and a second n-type dopant is implanted into the source region and the drain region to complete formation of the n-channel transistor.

According to a third embodiment, a p-channel transistor is formed. The p-channel transistor is formed having a second p-type (LDD) implant in both the source and drain regions. The method of producing the p-channel transistor comprises presenting a layer of gate oxide upon a silicon substrate and thereafter forming a layer of polysilicon upon the gate oxide. A first p-type dopant is implanted into the polysilicon at a peak concentration density residing a first depth below an upper surface of the polysilicon. Implantation of the first p-type dopant also comprises implanting barrier atoms into the polysilicon at a peak concentration density residing at a second depth below the upper surface of the polysilicon. The second depth is defined to be greater than (or below) the first depth. Portions of the implanted polysilicon as well as the gate oxide are removed to form a gate conductor interposed between an exposed pair of silicon substrate regions comprising a source region and a drain region. A layer of nitride is deposited across the drain region, the source region and the gate conductor. An opening is then formed through the layer of oxide to expose only the drain region and a sidewall surface of the gate conductor adjacent the drain region. A second p-type (LDD) dopant is implanted through the opening and into the exposed drain region. A drain-side spacer is then grown upon the exposed drain region and the sidewall surface. The layer of nitride is then removed and a third p-type (source/drain) dopant is implanted into the source region and the drain region to complete formation of the p-channel transistor.

According to a fourth embodiment, a p-channel device is formed having a second p-type (LDD) implant in only the drain region. The method includes forming a layer of gate oxide upon a silicon substrate and thereafter forming a layer of polysilicon upon the gate oxide. A first p-type dopant is then implanted into the polysilicon at a peak concentration density residing at a first depth, and barrier atoms are implanted into the polysilicon at a peak concentration residing at a second depth. The second depth is defined to be deeper than the first depth. Portions of the implanted polysilicon and gate oxide are then removed to form a gate conductor interposed between an exposed pair of silicon substrate regions comprised of a source region and a drain region. A second p-type dopant is implanted into the source region and the drain region, and thereafter a layer of nitride is deposited across the drain region, the source region and the gate conductor. An opening is formed through the layer of nitride to expose only the drain region and a sidewall surface of the gate conductor adjacent the drain region. The drain-side spacer oxide is grown upon the exposed drain region and the sidewall surface. The layer of nitride is then removed, and a third p-type dopant is implanted into the source region and the drain region to complete formation of the p-channel transistor.

According to a fifth embodiment, a p-channel device is formed having a nitrided oxide formed only across a portion of a gate conductor as well as the drain region. The nitrided oxide allows subsequently deposited oxide to collect thereon so as to enhance the drain-side spacer oxide relative to the source-side spacer oxide. The method includes the steps of forming a layer of gate oxide upon the silicon substrate and thereafter forming a layer of polysilicon upon the gate oxide. A first p-type dopant is implanted into the polysilicon to a peak concentration density residing at a first depth below an upper surface of the polysilicon. Barrier atoms are also implanted within the polysilicon to a peak concentration density residing at a second depth. The second depth is defined to be greater (or deeper than) than the first depth. Portions of the polysilicon and gate oxide are then removed to form a gate conductor. A second p-type (LDD) dopant is implanted into the source region and the drain region. The drain region, the source region and the gate conductor are then exposed to a $NH_3$ (ammonia), or an ambient containing other nitrogen bearing compounds, to form a nitrided oxide. An opening is then formed through the layer of nitrided oxide to expose only the source region and a sidewall surface of the gate conductor adjacent the source region. A source-side spacer oxide is then deposited upon the exposed source region and upon the nitrided oxide. The source-side spacer is removed except for a sidewall surface adjacent the source region and a portion of the nitrided oxide residing between the gate conductor and the drain region. A third p-type dopant is then implanted into the source region and the drain region to complete formation of the p-channel transistor.

According to a sixth embodiment, a p-channel device is formed having a nitrided oxide formed only across a portion of the gate conductor and the source region. The nitrided oxide forms a substantial barrier against oxide growth and particularly the extended sidewall growth on the drain-side of the gate conductor. The method includes providing a silicon substrate having a source region and a drain region laterally spaced from each other by a gate conductor. The drain region, source region and gate conductor are then exposed to a nitrogen-bearing ambient to form a nitrided oxide. An opening is formed through the layer of nitrided oxide to expose only the drain region and a sidewall surface of the gate conductor adjacent the drain region. A first p-type (LDD) dopant is implanted through the opening and into the exposed drain region. A drain-side spacer is grown upon the exposed drain region and the sidewall surface adjacent the drain. While retaining the layer of nitrided oxide, a second p-type dopant is implanted into the source region and the drain region to complete formation of the p-channel transistor.

According to a seventh embodiment, a method is provided for forming a p-channel transistor. The method includes providing a silicon substrate having a source region and a drain region laterally spaced from each other by a gate conductor. The drain region, source region and gate conductor are exposed to a nitrogen and oxygen ambient to form a nitrided oxide. A first p-type (LDD) dopant is implanted through the nitrided oxide and into the source region and the drain region at an angle Ø within the range between 20 and 70 degrees relative to the upper surfaces of the source and drain region. A source-side and drain-side oxide is then deposited upon the nitrided oxide. The source-side and drain-side oxide is removed from surfaces except for the nitrided oxide surfaces immediately adjacent sidewall surfaces of the gate conductor. A second p-type dopant is then implanted through the deposited oxide and the nitrided oxide into the source region and the drain region at an angle substantially perpendicular to the source and drain region upper surfaces.

BRIEF DESCRIPTION OF THE DRAWINGS

Other objects and advantages of the invention will become apparent upon reading the following detailed description and upon reference to the accompanying drawings in which:

FIGS. 1a–9a are cross-sectional views of a semiconductor substrate undergoing a sequence of processing steps needed to form an asymmetrical n-channel transistor which employs LDD implant into both source and drain sides of the transistor and selective sidewall growth on only the drain-side of the polysilicon gate in accordance with a first embodiment of the present invention;

FIGS. 1b–4b are cross-sectional views of a semiconductor substrate depicted as undergoing a select set of processing steps within a sequence of processing steps needed to form an asymmetrical n-channel transistor which employs LDD implant only into the drain-side of the transistor and selective sidewall growth only upon the drain-side of the polysilicon gate in accordance with a second embodiment of the present invention;

FIGS. 1c–4c are cross-sectional views of a semiconductor substrate depicted as undergoing a select set of processing steps within a sequence of processing steps needed to form an asymmetrical p-channel transistor which employs a barrier implant within the polysilicon gate, LDD implant to both source and drain sides of the transistor, and selected sidewall growth on only the drain-side of the polysilicon gate in accordance with a third embodiment of the present invention;

FIGS. 1d–4d are a cross-sectional view of a semiconductor substrate depicted as undergoing a select set of processing steps within a sequence of processing steps needed to form an asymmetrical p-channel transistor which employs a barrier implant within the polysilicon gate, LDD implant only into the drain side of the transistor, and selected sidewall growth on only the drain side of the polysilicon gate in accordance with a fourth embodiment of the present invention;

FIGS. 1e–4e are a cross-sectional view of a semiconductor substrate depicted as undergoing a select set of processing steps within a sequence of processing steps needed to form an asymmetrical p-channel transistor which employs a barrier implant within the polysilicon gate, LDD implant into both source and drain sides of the transistor, nitrided oxide across a portion of the polysilicon gate and the drain, and enhanced sidewall formation resulting from nitrided oxide and deposited oxide on the drain side of the polysilicon gate in accordance with a fifth embodiment of the present invention;

FIGS. 1f–4f are cross-sectional views of a semiconductor substrate depicted as undergoing a select set of processing steps within a sequence of processing steps needed to form an asymmetrical p-channel transistor which employs LDD implant into both the source and drain sides of the transistor, nitrided oxide across a portion of the polysilicon gate and the source, and selected sidewall growth upon only the drain side of the polysilicon gate in accordance with a sixth embodiment of the present invention; and FIGS. 1g–4g are cross-sectional views of a semiconductor substrate depicted as undergoing a select set of processing steps within a sequence of processing steps needed to form an asymmetrical p-channel transistor which employs large tilt angle ("LTA") LDD implant into both the source and drain sides of the transistor, nitrided oxide across the entire transistor, and sidewall deposition on both the source and drain sides of the polysilicon gate in accordance with a seventh embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1A:
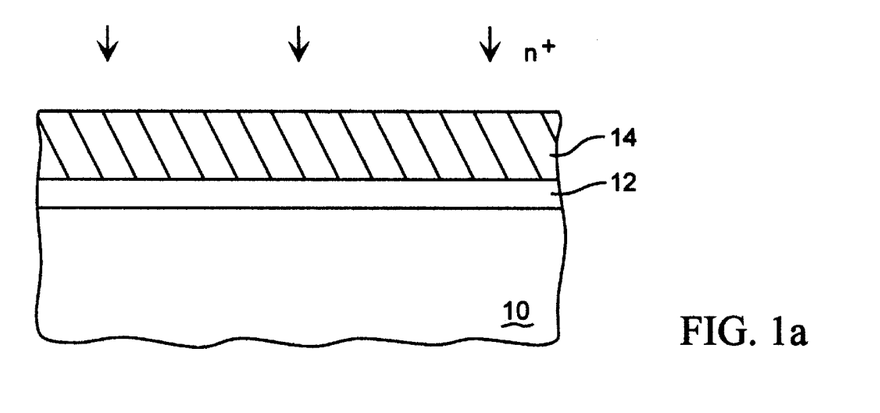

Turning now to the drawings, FIG. 1a illustrates a semiconductor substrate 10 suitable for producing either an NMOS device or a PMOS device according to various embodiments of the present invention. Substrate 10 is preferably single crystal silicon material having pre-existing impurities placed therein. The impurities are selected as either n-type or p-type impurities depending upon whether the ensuing device will be a p-channel or n-channel device, respectively. For example, a CMOS process may utilize an n-type substrate with p-type wells placed therein. The n-type substrate serves to receive p-type LDD and source/drain implants, while the p-type wells receive n-type LDD and source/drain implants. Upon the upper surface of substrate 10 is a gate oxide. Gate oxide 12 is formed by exposing the upper surface to an oxidizing ambient where the oxidizing ambient can either be dry oxygen or steam. Gate oxide 12 is grown to a thickness sufficient for it to operably isolate a gate conductor formed thereon. The thickness of oxide 12 can therefore vary depending upon process consideration and design constraints available to the process engineer. Deposited upon gate oxide 12 is a layer of polycrystaline silicon ("polysilicon") material 14. Polysilicon 14 can be rendered conductive since it serves as host for impurities subsequently implanted therein.

Preferably, polysilicon 14 is forwarded to an ion implanter which subjects the polysilicon to an implant species of the same type as the ensuing LDD and source/drain implant. According to one embodiment, an n-channel device is to be fashioned from an n-type implant forwarded into polysilicon 14 as shown in FIG. 1a. A suitable n-type implant of phosphorous is chosen at a dosage and energy level necessary to allow polysilicon 14 to contain a majority if not substantially all of the implant species.

Figure 2A:
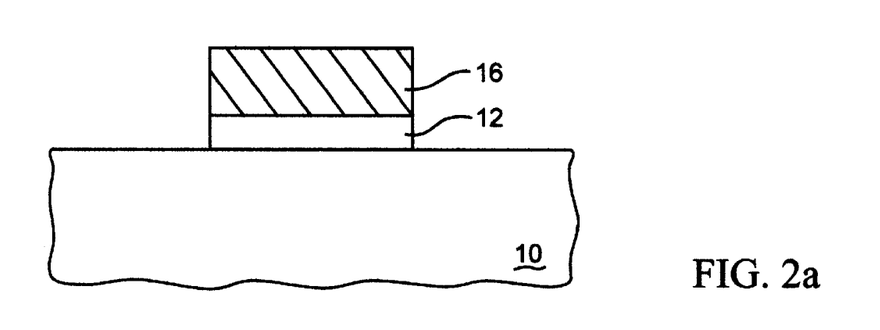

FIG. 2a illustrates the processing steps subsequent to FIG. 1a, wherein polysilicon 14 and gate oxide 12 are selectively removed. Removal of layers 14 and 12 is achieved using photolithography, whereby photoresist (not shown) is deposited across the exposed surface. A mask is then used to selectively polymerize the photoresist above regions which are to be protected. The non-polymerized photoresist, and layers immediately below that photoresist are removed using various etch techniques: either a dry (plasma) or wet removal process. The retained portions of layer 14 is herein referred to as a gate conductor 16 dielectrically spaced above substrate 10 by the remaining gate oxide 12.

Figure 3A:
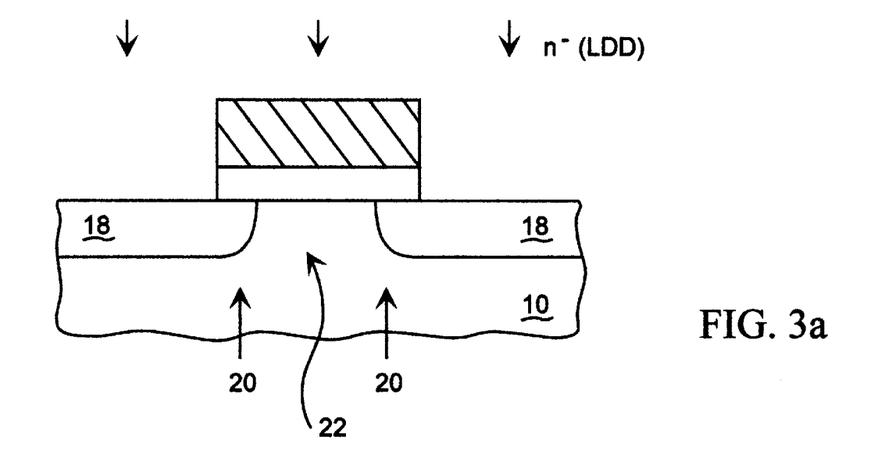

FIG. 3a depicts a processing step subsequent to FIG. 2a, wherein an LDD implant is forwarded into the exposed surface at substantially a perpendicular angle to that surface. As such, the LDD implant does not involve a tilt angle, as shown. Gate conductor 16 serves to self-align the LDD implant region 18 with the polysilicon edges 20 of gate conductor 16. The implant naturally disperses along both the vertical and horizontal planes such that slight encroachment of LDD region 18 into channel 22 occurs. The resulting channel length is thereby designated as Leff.

Figure 4A:
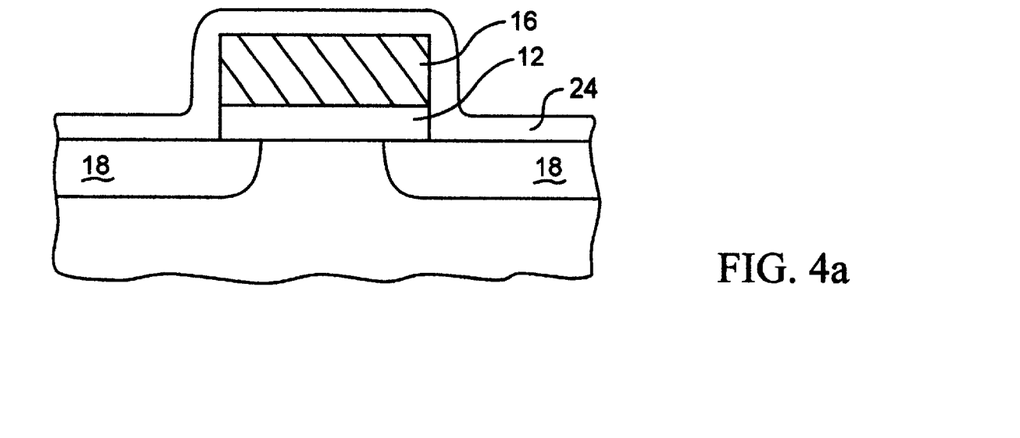
Figure 5A:
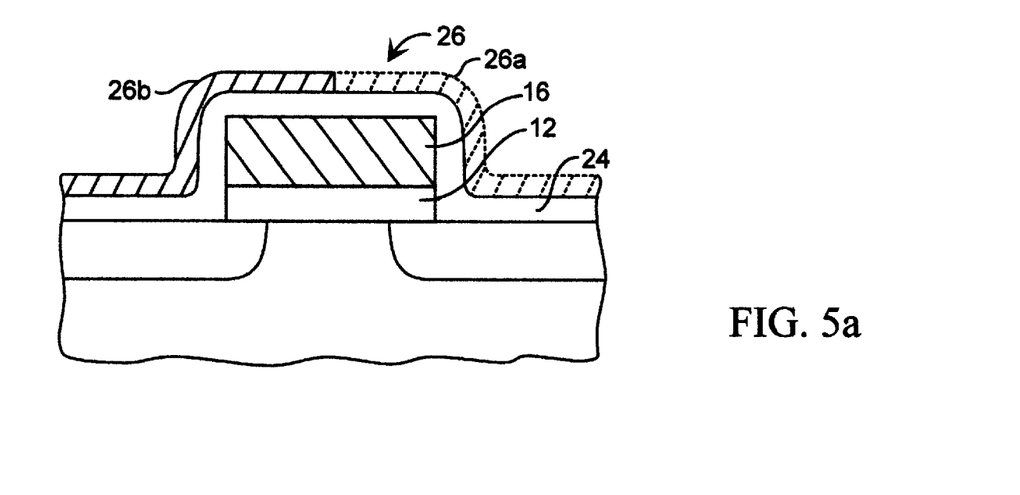

FIG. 4a depicts a processing step subsequent to FIG. 3a wherein a thin (approximately 100 angstroms) oxide 24 is grown across the exposed surfaces of implant region 18, gate oxide 12 and gate conductor 16. The dosage and energy levels used to form LDD region 18 can vary. A suitable dose of phosphorous can, for example, be $1\times10^{13}$ to $1\times10^{14}$ atoms /cm$^2$. Likewise, the thickness of oxide 24 can vary depending upon the amount of isolation needed at the substrate surface, a suitable thickness being, e.g., 80 to 200 angstroms. Oxide 24 can be grown either in a dry or wet ambient, whereby the implant of n-type impurities into layer 14 (shown in FIG. 1a) enhances the growth rate of oxide 24 (shown in FIG. 5a). Once a suitable thickness of oxide 24 is achieved, a layer of CVD or PECVD nitride 26 is blanket deposited across the exposed surface, i.e., across oxide 24. Thereafter, select regions of nitride 26 are subjected to photolithography and thereafter removed to expose oxide 24 directly above approximately one half of gate conductor 16 and above only the drain side of the transistor. The removed nitride is shown as reference numeral 26a, and the retained portion of nitride 26 is denoted as reference numeral 26b.

Figure 6A:
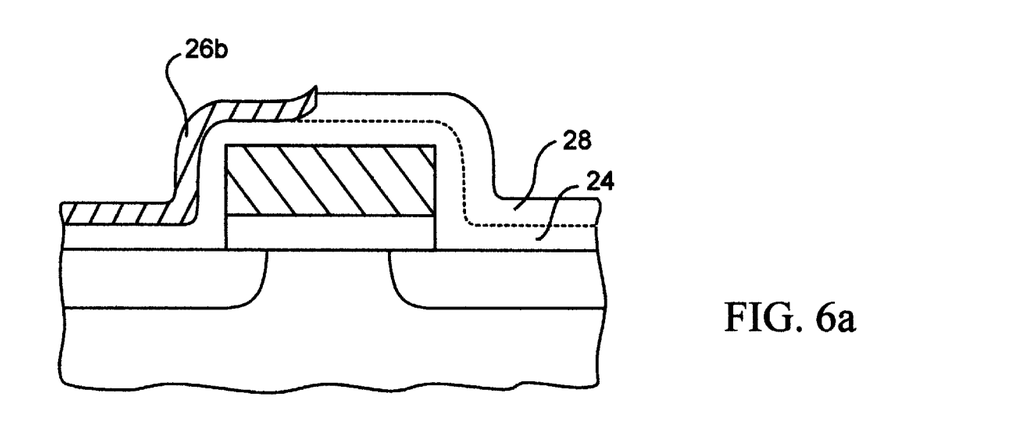

Removal of nitride 26 in area 26a affords further thermal growth of oxide 24, as shown in FIG. 6a. A suitable growth amount is between 500 to 1000 angstroms, depending on the technology target polysilicon length. The additional oxide is depicted as reference numeral 28. Of importance is the additional oxide 28 at the sidewall surface of gate conductor 16 at the drain-side of the ensuing transistor. The source-side is prevented from additional oxide growth by virtue of retained nitride 26b. For ease and understanding, the drawings henceforth indicate consistency in having the source-side of the transistor on the left-side of the drawings and the drain-side of the transistor on the right side.

Figure 7A:
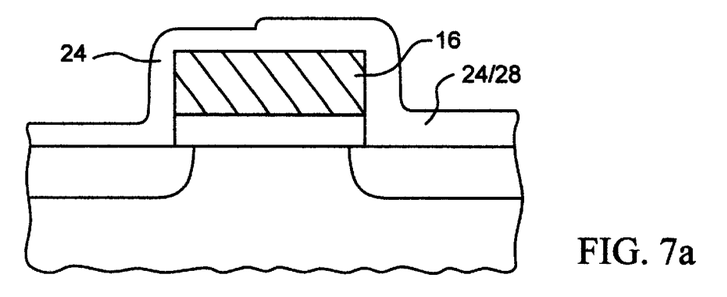

FIG. 7a indicates a processing step subsequent to FIG. 6a, wherein the remaining nitride 26b is removed. FIG. 7a illustrates an overall oxide layer which is thicker on the drain side than on the source side. More importantly, the thicker oxide exists on the sidewall surface of conductor 16 adjacent the drain.

Figure 8A:
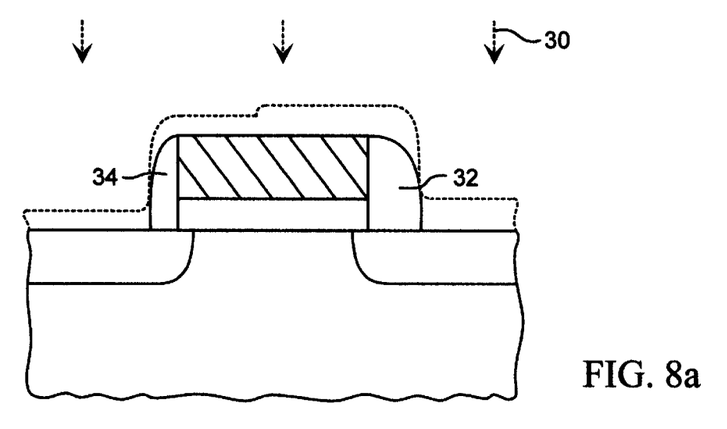

FIG. 8a indicates a processing step subsequent to FIG. 7a, wherein anisotropic etch is applied to the exposed oxides 24 and 28. In accordance with anisotropic techniques, horizontal surfaces of the exposed oxide are removed at a faster rate than vertical surfaces. Anisotropic etching generally employs ions directed substantially perpendicular to the exposed horizontal surfaces. The bombarding ions and the chemical composition of those ions force an interaction with horizontal surfaces at a faster rate than vertical surfaces. A combination of physical and chemical interactions along the perpendicular axis 30 serves to retain oxide at or near the substantially vertical, sidewall surfaces of gate conductor 16. The retained oxide is illustrated on the drain-side as reference numeral 32. More specifically, the drain-side retained oxide is henceforth referred to as drain-side spacer 32. The sidewall spacer on the source side is indicated with a reference numeral 34, and is henceforth referred to as source-side spacer 34. FIG. 8a indicates the thicker drain-side spacer 32 relative to the source-side spacer 34. This asymmetrical feature is advantageously applied in reference to FIG. 9a.

Figure 9A:
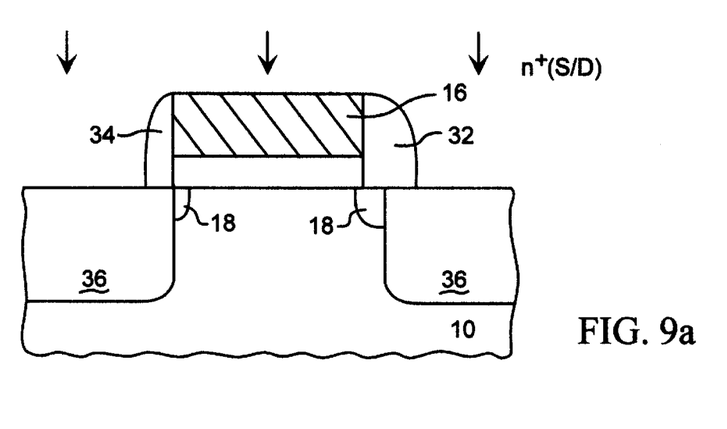

FIG. 9a indicates a processing step subsequent to FIG. 8a, wherein a source/drain implant is applied to the exposed surface. Similar to the LDD implant, source/drain implant occurs substantially perpendicular to the upper surface. In some instances, the implant angle may be approximately 7 degrees off perpendicular, if desired. The source/drain implant is performed at a dosage greater than the LDD implant, and preferably employs arsenic to form the source and drain n-type regions. The arsenic can be employed at a dose of approximately $1\times10^{15}$ atoms/cm$^2$. The energy levels used to forward the source/drain implant can vary depending upon the energy levels used to form the LDD implant. Either a larger energy or smaller energy relative to the LDD implant can be used. The source and drain implant regions are shown as reference numerals 36 in FIG. 9a. Similar to LDD implant 18, source/drain implant species may migrate slightly toward the channel. However, due to the lateral spacing afforded by spacers 32 and 34, source/drain implant 36 is drawn away from the channel. The amount by which implant 36 is drawn from the channel depends upon the relative thickness of spacers 32 and 34. Since drain-side spacer 32 is thicker than source-side spacer 34, drain implant is drawn further than source implant. This results in LDD 18 at the drain-side being larger in lateral area than LDD 18 at the source-side. This advantage not only disperses Em along the large drain-side LDD beginning at a point beneath the gate conductor edge and extending well beyond the edge, but also reduces unnecessary parasitic resistance/capacitance at the source-side LDD.

FIG. 9a concludes the formation of the asymmetrical sidewall spacers and LDD structure. However, it is understood that subsequent processing steps are used to complete the interconnection of gate conductor 16 as well as source/ drain regions 36 to various other transistors employed on the same monolithic substrate as the transistor shown. Processing steps therefore occur subsequent to FIG. 9a for interconnecting the various structures of an n-channel transistor. For sake of brevity, the subsequent processing steps are not shown, and are not critical to the understanding of the present invention. Similarly, a p-channel transistor could be formed with the same process sequence, substituting $B_{11}$ and $BF_2$ for As and P implants, and starting with an n-well or n-type substrate.

Turning now to FIGS. 1b–4b, a second embodiment used to form an n-channel transistor according to a subset of the previous processing steps is shown. For sake of brevity, only critical processing steps distinguishable from the processing steps shown in FIGS. 1a–9a are provided. In particular, only deviations necessary to the understanding of the second embodiment are illustrated relative to the first embodiment shown in FIGS. 1a–9a.

Figure 1B:
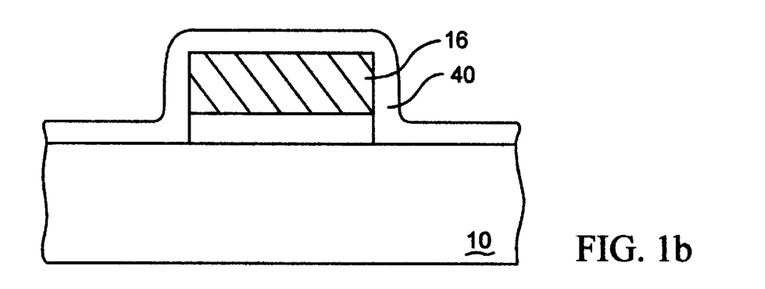
Figure 2B:
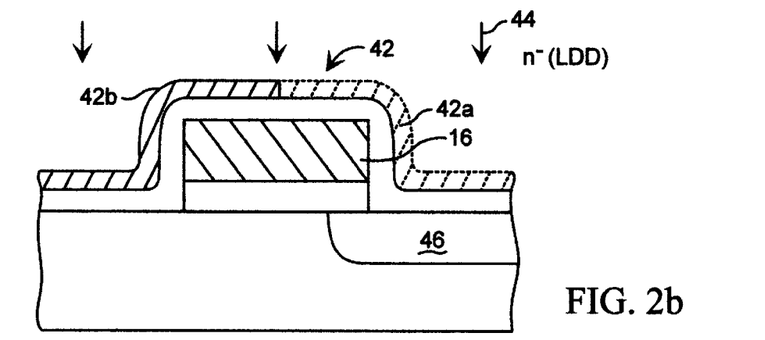

FIG. 1b illustrates a processing step subsequent to FIG. 2a, wherein an oxide 40 is grown across the exposed gate conductor 16, gate oxide 12 and semiconductor substrate 10. Oxide 40 is grown in either a dry or wet oxygen-bearing ambient to approximately 100 angstroms, for example. Oxide 40 serves as an isolation layer between a subsequently placed nitride and the underlying topography. FIG. 2b illustrates nitride 42 deposited according to various chemical vapor deposition ("CVD") techniques. Nitride 42 can thereafter be selectively removed in areas 42a, leaving retained portions 42b. The purpose behind leaving nitride 42b is to serve as a barrier or mask against subsequently implanted n-type dopant 44. The n-type (LDD) dopant is preferably phosphorous and implanted at approximately the same concentration density described above. A primary feature of nitride 42b is therefor to ensure that LDD is formed only in the drain region 46. Thus, retained nitride 42b and gate conductor 16 serve to self align the LDD implant species only into the drain-side areas of the n-channel transistor.

Figure 3B:
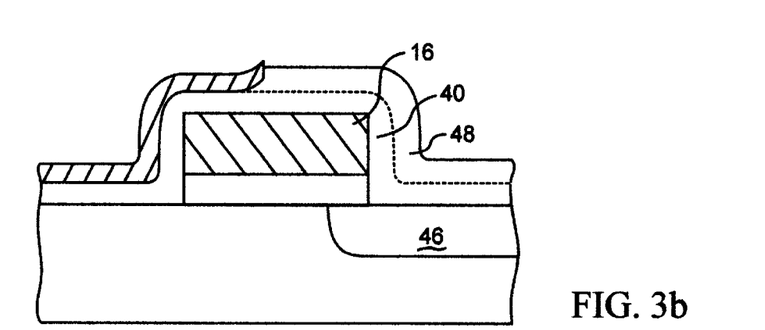
Figure 4B:
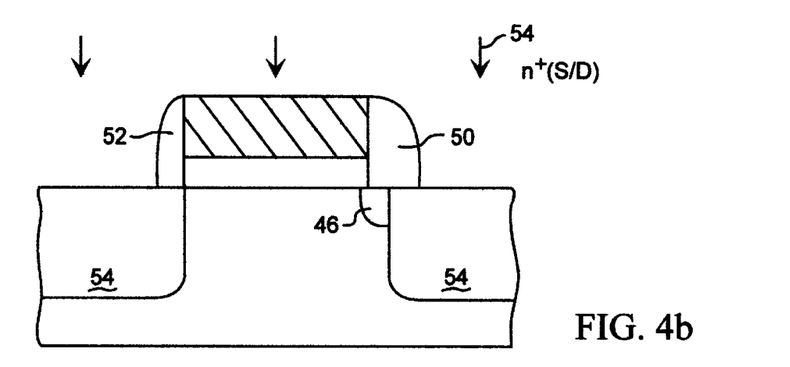

FIG. 3b illustrates a processing step subsequent to FIG. 2b, wherein the exposed portions of oxide 40 underlying removed nitride 42a are further oxidized in an oxygen-bearing ambient to create additional oxide 48. Thus, the combination of oxide 40 and additional oxide 48 allows for a thicker oxide at the sidewall surface of conductor 16. Importantly, however, the thicker oxide appears only at the drain-side of conductor 16. The difference in thickness is readily apparent, and thereby useful in producing an asymmetrical n-channel transistor given the previously described processing steps of FIGS. 6a through 8a. Accordingly, a conclusion processing step is provided in reference to FIG. 4b. FIG. 4b illustrates a drain-side oxide 50 which is thicker than the source-side oxide 52, both of which are produced as a result of anisotropic etching. The difference between the structure shown in FIG. 4b and that shown in FIG. 9a is the complete absence of a source-side LDD implant in FIG. 4b. The source/drain implant 54 occurs in both the source and drain areas, however, the LDD implant in the second embodiment pre-exists only in the drain-side of the channel. The necessity for avoiding any LDD in the source-side is to ensure that no parasitic resistance/capacitance is present in applications where speed/performance is critical. Thus, the second embodiment illustrated in FIGS. 1b–4b is useful in manufacturing an n-channel transistor which, relatively speaking, can operate at higher frequencies than the n-channel transistor produced as a result of the first embodiment. The embodiment of FIGS. 1b–4b is indicative of the usefulness in employing an LDD only at the drain-side of a channel. A p-channel transistor could be formed with the same process sequence, substituting $B_{11}$ and $BF_2$ for As and P implants, and starting with an n-type substrate or n-type well.

Turning now to FIGS. 1c–4c, a third embodiment is used to form a p-channel transistor according to a subset of processing steps previously shown. FIGS. 1c–4c are only the critical processing steps which distinguish the third embodiment sequence from the first and second embodiments. For sake of brevity, all the processing steps used to establish a p-channel transistor according to the third embodiment are not shown. It is understood, however, that the important difference between the first, second and third embodiments are only those which are shown.

Figure 1C:
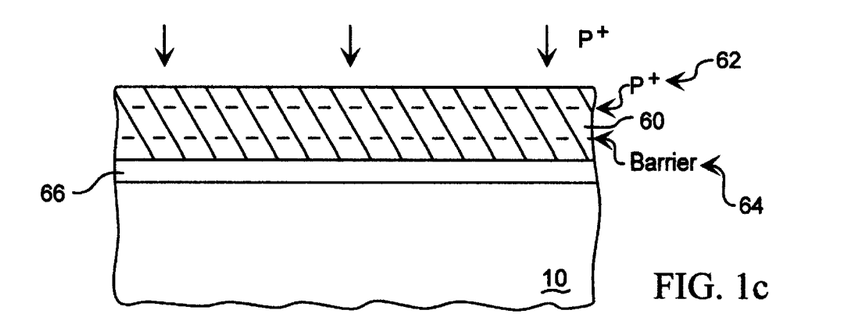

FIG. 1c illustrates a processing step dissimilar from FIG. 1a, whereby both a p-type species and a barrier species are placed within polysilicon material 60. The p-type species can be implanted either before or after, or simultaneous with, the barrier species. Importantly, the p-type species is implanted at a concentration peak density shallower than the concentration peak density at which the barrier ions are implanted. The relative depths at which the p-type and barrier ions concentration peak densities are implanted are depicted as reference numeral 62 and 64, respectively. As illustrated, the peak concentration densities reside at a depth exclusively within polysilicon material 60. The deeper depth of barrier species 64 helps ensure that the p-type species 62 do not significantly migrate past the barrier and into the underlying gate oxide 66. Thus, the barrier atoms serve to "plug" migration avenues within polysilicon 60 to prevent what would normally be fast migrating, low atomic mass p-type implant species. A suitable barrier species includes nitrogen, or any type of generally inert species. A suitable p-type species includes B, $BF_2$, $B^{11}$, or any derivative thereof. In some technologies, however, a barrier species may not be needed especially if the boron implant is carefully controlled relative to the polysilicon layer thickness. In these instances, a p-channel transistor can be formed similar to the sequences shown in FIGS. 1a–9a or 1b–4b, using a non-barrier embodied polysilicon followed by a p-type implant species instead of phosphorous and/or arsenic.

Figure 2C:
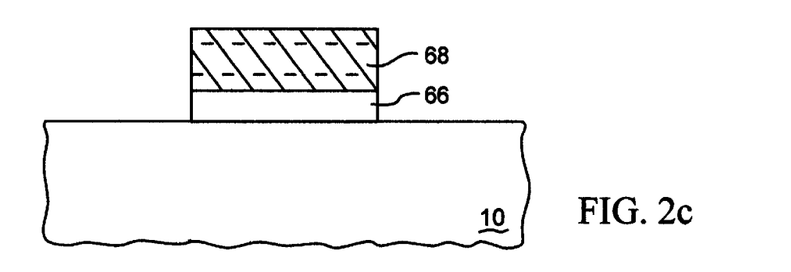

FIG. 2c illustrates a processing step subsequent to FIG. 1c, wherein portions of the pre-implanted polysilicon 60 and gate oxide 66 are removed to form a gate conductor 68 and a patterned gate oxide 66 overlying substrate 10.

Figure 3C:
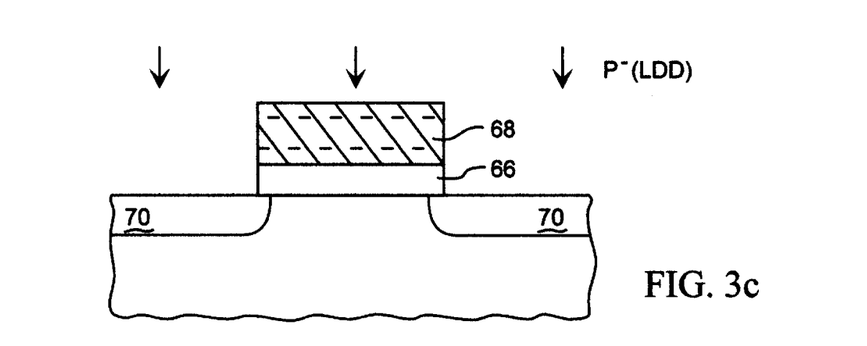

FIG. 3c illustrates a processing step subsequent to FIG. 2c, whereby a p-type (LDD) dopant is forwarded into substrate 10. Gate conductor 68 serves to self-align the LDD species with the edge of the gate. Given a reasonable amount of lateral diffusion, p-type LDD regions 70 are formed having a lateral boundary well below the edge of the gate and slightly into the channel area, similar to but to a slightly greater extent than the n-type LDD regions shown in FIG. 3a.

Figure 4C:
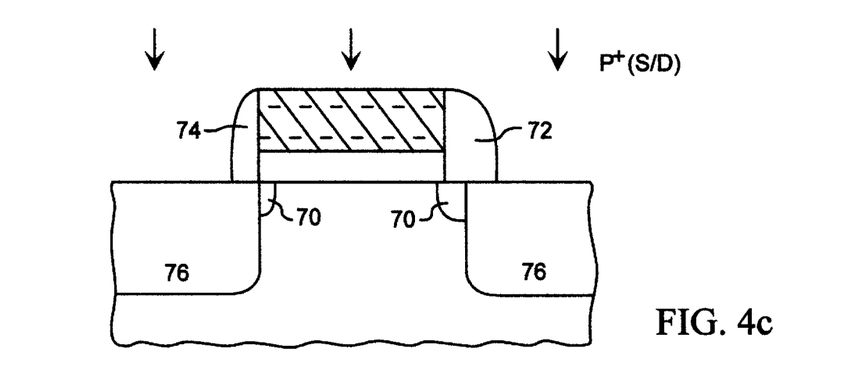
Figure 4D:
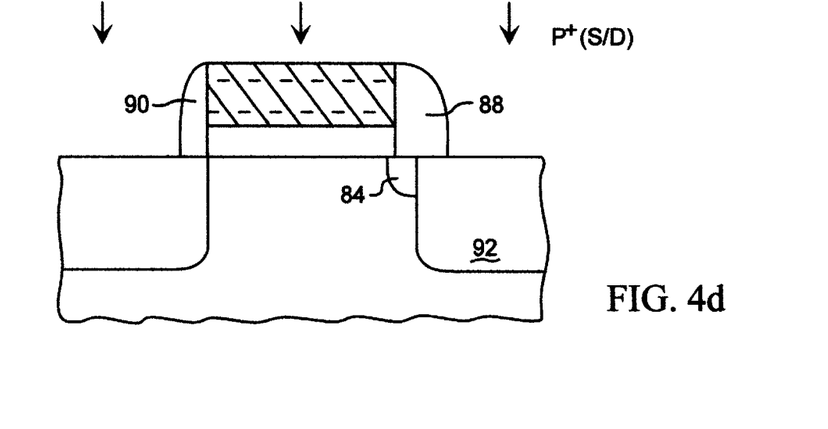

After numerous processing steps similar to those shown in FIGS. 4a–8a, a processing step shown in FIG. 4c occurs. More specifically, the processing sequence which occurs between FIGS. 3c and 4c is indicative of a grown oxide formed across LDD 70, patterned gate oxide 60 and gate conductor 68. Following the grown oxide, is a deposited, and thereafter patterned nitride layer. The patterned opening through the nitride layer affords additional growth of oxide and the asymmetrical drain-side oxide 72 being greater in thickness than the source-side oxide 74. The asymmetrical features of drain-side and source-side spacers 72 and 74, respectively, allows the source/drain implant 76 to be drawn away from the inside lateral boundary of LDD implant regions 70 by dissimilar amounts. Thus, the lateral area of LDD regions 70 differ depending on whether those regions are on the source-side or the drain-side of the ensuing p-channel transistor.

Accordingly, the processing sequence shown in FIGS. 1c–4c is similar to the sequence shown in FIGS. 1a–9a, except for the application to a p-channel transistor and the important use of pre-existing barrier atoms within the gate conductor 68. Barrier atoms help prevent the migration of mobile boron or fluorine atoms into the gate oxide and underlying channel. Absent the properly placed barrier atoms, migration may occur which can deleteriously affect the threshold voltage and sub-threshold current of the p-channel transistor.

Turning now to FIGS. 1d–4d, a fourth embodiment used to form a p-channel transistor according to a subset of processing steps is shown. Only the critical processing steps are shown for sake of brevity. Prior to FIG. 1d, the processing steps are similar to those shown in FIGS. 1c and 2c, and between FIGS. 3d and 4d, the processing steps are similar to those shown in FIGS. 6a–8a.

Figure 1D:
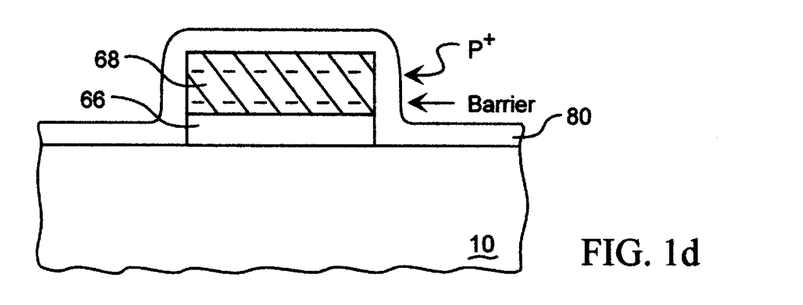
Figure 2D:
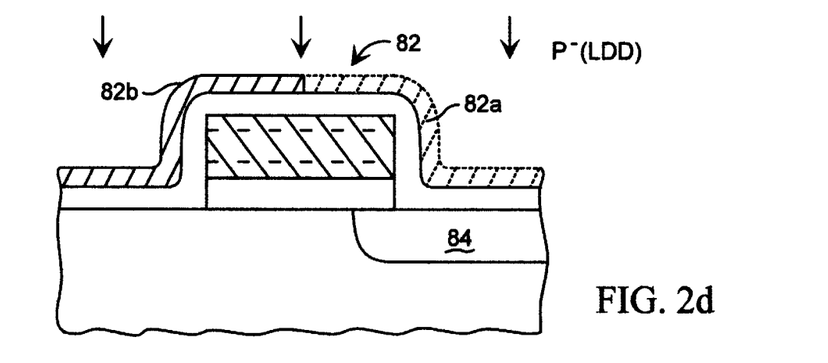

FIG. 1d indicates a processing step, wherein an oxide 80 is grown across the pre-implanted gate 68, the gate oxide 66 and substrate 10. Subsequent to the processing steps shown in FIG. 1d, a p-type (LDD) implant occurs only in regions in which nitride 82a is removed. Thus FIG. 2d illustrates a processing step prior to LDD implant in which nitride 82 is deposited across the entire topography followed by selective removal in regions 82a and retainage in regions 82b. The removed regions 82a thereby allow passage of LDD implant into LDD region 84.

Figure 3D:
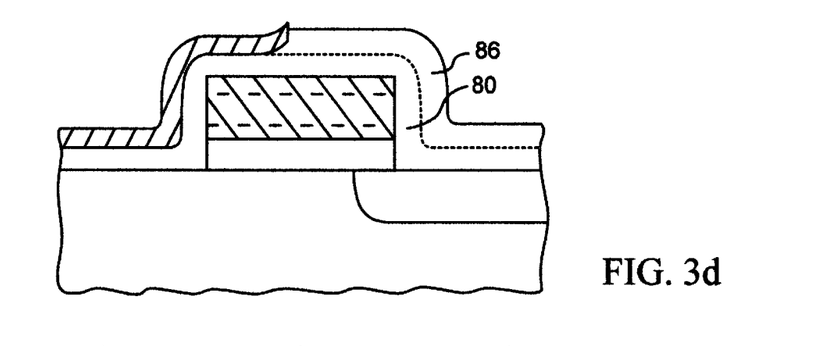

FIG. 3d illustrates a processing step subsequent to FIG. 2d wherein an additional oxide 86 is grown upon the exposed regions associated with removed nitride 82a. Additional oxide 86 allows a thicker drain-side oxide 88 relative to the source-side oxide 90. This asymmetrical result thereby achieves a drain-side LDD 84, and no source-side LDD. Moreover, the source/drain region 92 is drawn sufficiently away from the lateral inside edge of LDD region 84 as shown.

Figure 1E:
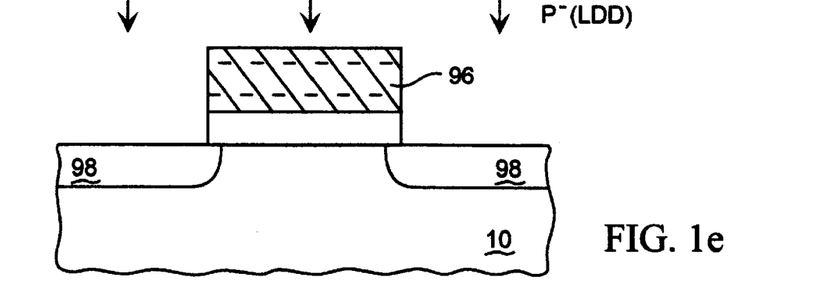

Turning now to FIGS. 1e–4e, a fifth embodiment used to form a p-channel transistor according to a subset of previously described processing steps is shown. FIG. 1e is depicted as a processing step similar to the processing step shown in FIG. 3c, and it is understood that processing steps subsequent to FIG. 4e occur to effect interconnection to not only the gate conductor but the source/drain regions as well.

Figure 2E:
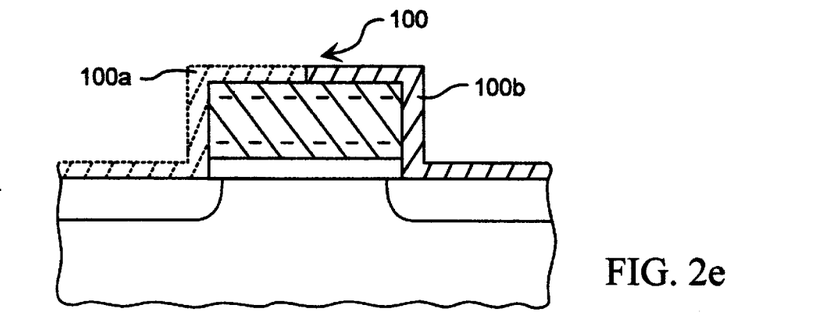

FIG. 1e depicts a gate conductor 96 interposed on a substrate surface 10 between p-type LDD implant regions 98. Following LDD implant, the exposed upper surfaces of silicon-containing materials (i.e., LDD-implanted substrate 98, gate oxide and gate conductor 96) are exposed to a nitrogen and oxygen-bearing ambient to form a nitrided oxide. The nitrided oxide is shown in FIG. 2e as reference numeral 100. The nitrided oxide is thereby grown from the silicon base material using a temperature cycle and a growing species, i.e., nitrogen and oxygen. Subsequently, portions of the nitrided oxide 100 are removed in regions 100a, while other regions are retained as shown by reference numeral 100b. The retained nitrided oxide 100b exists across the drain, while the source is exposed.

Figure 3E:
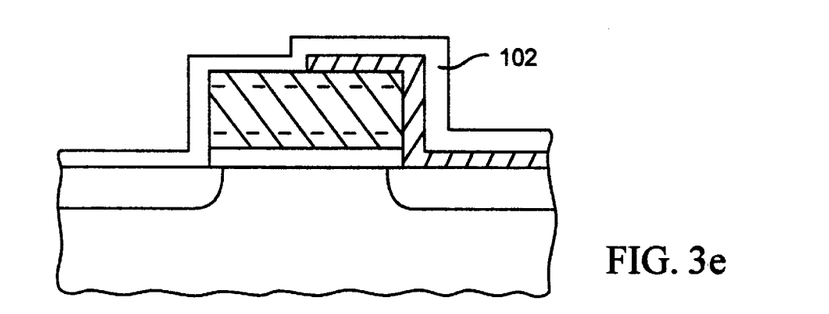

FIG. 3e illustrates an oxide 102 deposited upon the retained nitrided oxide 100b as well as across the exposed topography removed of nitrided oxide. Oxide 102 can be deposited using CVD techniques, for example.

Figure 4E:
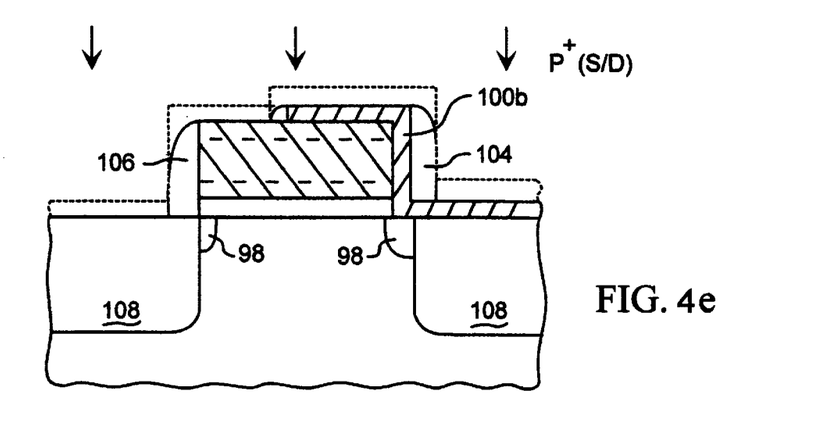

FIG. 4e illustrates a processing step subsequent to FIG. 3e, wherein the horizontal surfaces of oxide 102 are removed leaving an asymmetrical sidewall structure. The sidewall structure 104 adjacent the drain is thicker than the sidewall structure 106 adjacent the source due primarily to the added thickness of nitrided oxide 100b at that sidewall. The asymmetrical sidewall structures 104 and 106 afford dissimilar lateral areas for LDD regions 98, depending upon whether the LDD resides upon the drain-side or the source-side. The dissimilar LDD areas are achieved by implanting source/drain p-type impurities into source/drain regions 108. A lateral extension of regions 108 are thereby defined by the asymmetrical thicknesses of sidewall structures 104 and 106.

Figure 1F:
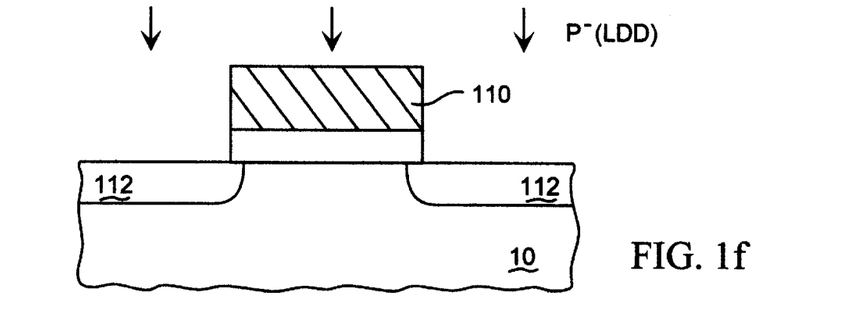

Turing now to FIGS. 1f–4f, a sixth embodiment used to form a p-channel transistor according to a subset of processing steps is shown. FIG. 1f indicates a processing step subsequent to FIGS. 1a and 2a, except a p-type implant is used in the gate conductor 110 instead of an n-type implant. Gate conductor 110 can either be undoped or, preferably, doped with a p-type implant. Subsequent the formation of gate conductor 110, is the implant of p-type (LDD) dopants into LDD regions 112.

Figure 2F:
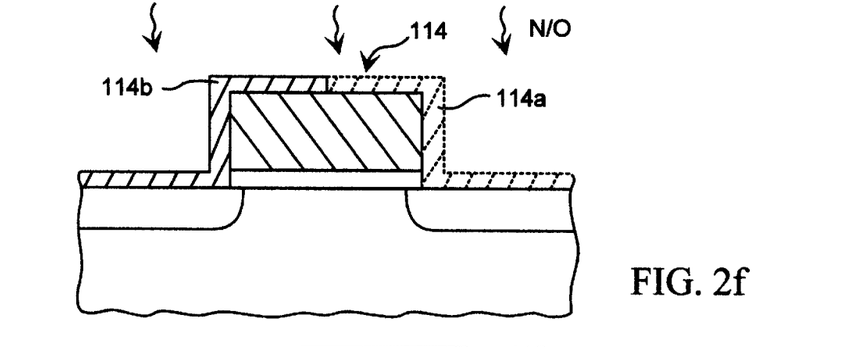

FIG. 2f illustrates a processing step subsequent to FIG. 1f wherein the topography is exposed to a nitrogen and oxygen-bearing (or ammonia bearing) ambient to form a nitrided oxide 114. Nitrided oxide 114 may be either an LPCVD or PECVD nitride or oxynitride. Nitrided oxide 114 is patterned and removed in regions 114a while regions 114b are retained. The nitrided oxide is formed by exposing the upper silicon-bearing topography to an elevated temperature within the range of 900° to 1100° C. while retaining a nitrogen and oxygen ambient adjacent the surface topography. Any silicon within the exposed topography will be converted to a nitrided silicon dioxide.

Figure 3F:
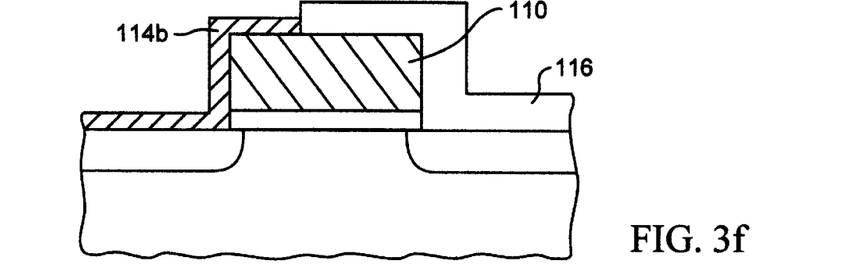

FIG. 3f illustrates a processing step subsequent to FIG. 2f whereby the exposed drain underlying the removed nitrided oxide 114a is subjected to an oxide growth 116 upon the drain region as well as along the sidewall surface of gate conductor 110. Nitrided oxide 114b, however, prevents oxide growth upon or beneath the oxygen-impermeable barrier afforded by nitrided oxide 114b.

Figure 4F:
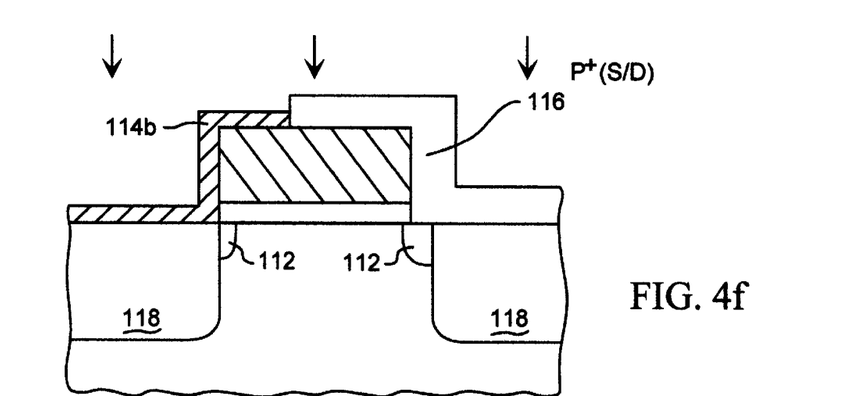

Subsequent to the step shown in FIG. 3f is FIG. 4f which indicates source/drain implant across the topography and into source/drain regions 118. The asymmetrical sidewall surfaces allows an asymmetrical LDD 112 to appear at the inner junction of the source/drain regions 118. The grown oxide across the drain and drain-side sidewall is shown in FIG. 3f. The process sequence shown in FIGS. 1f to 4f can equally apply to forming an n-channel device by substituting n-type species for the p-type species.

Figure 1G:
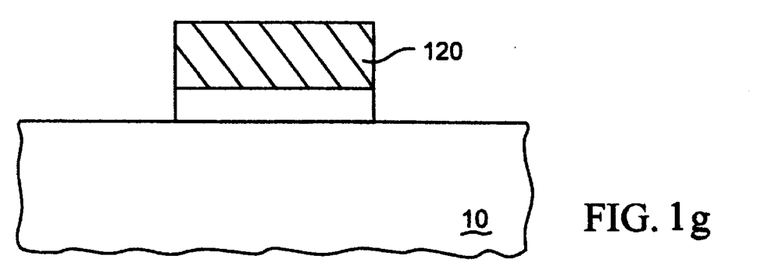

Turning now to FIGS. 1g–4g, a seventh embodiment used to form a p-channel transistor according to a subset of processing steps is shown. FIG. 1g indicates a processing step subsequent to FIG. 2a. However, instead of utilizing an n-type implant into the polysilicon material, FIG. 1g either does not use any implant whatsoever within the polysilicon material or, instead, uses a p-type implant. Thus, FIG. 1g indicates a gate conductor 120 and a gate oxide formed upon substrate 10.

Figure 2G:
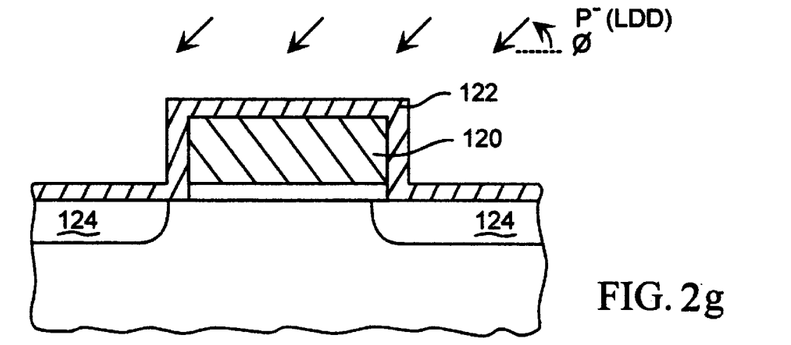

The upper topography is exposed to a nitrogen and oxygen-bearing ambient to form a nitrided oxide 122, shown in FIG. 2g. Thereafter, a p-type (LDD) implant in forwarded to the resulting topography at an implant angle which is not perpendicular to the upper surface. The chosen implant angle is therefore not vertical or substantially vertical as in the previous embodiments. Instead, the implant is chosen between 20° and 70° relative to the upper horizontal surfaces. The angle Ø is achieved by tilting the implant source or the substrate relative to one another so that the angle of impingement is non-perpendicular to the upper horizontal surface. Non-perpendicular implant is often referred to as large tilt angle ("LTA") implant. Resulting from the LTA, implant LDD regions 124 form in accordance with the implant angle. The lateral boundary of the LDD region on the drain-side extends well beneath the edge of the gate conductor 120, whereas the lateral boundary of the LDD region on the source-side extends away from and not beneath the edge of gate conductor 120. The asymmetrical LDD is then formed knowing the relative position of all drain areas in relation to all source areas. The LTA implant must thereby take note of where the drain regions are relative to the source regions. Further in this embodiment, it is necessary that all the drain regions of transistors across the semiconductor substrate all be aligned with and on the same side as the gate conductor 120, and all the source regions must be aligned on the other side. The embodiment hereof is then better suited for memory structures which can take advantage of a consistent and regular source/drain layout across the entire wafer.

Figure 3G:
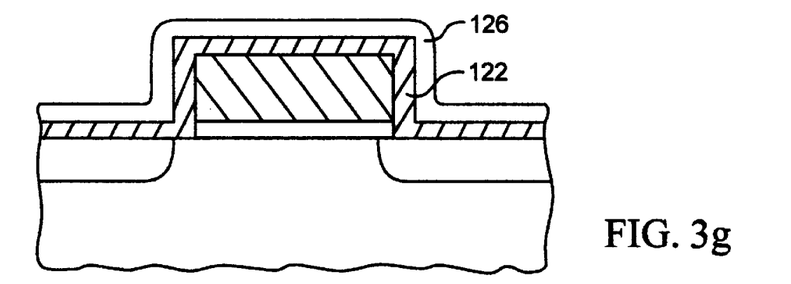
Figure 4G:
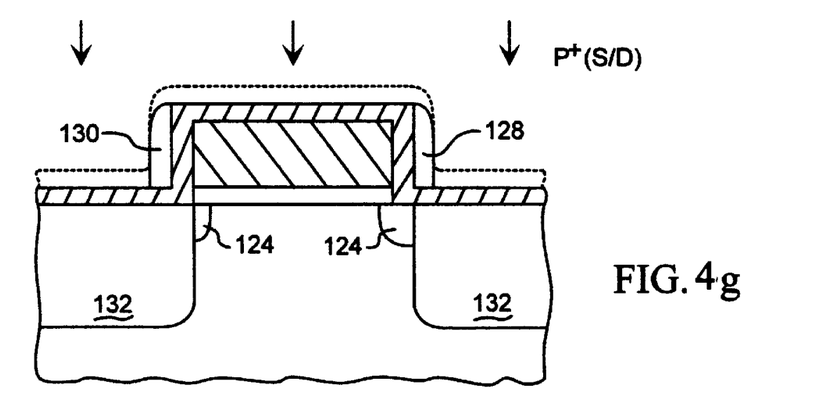

FIG. 3g illustrates a processing step subsequent to FIG. 2g, wherein an oxide 126 is deposited across the nitrided oxide 122. Deposited oxide 126 is formed preferably from CVD techniques. Subsequent to the steps shown in FIG. 3g, FIG. 4g illustrates an anisotropic removal of only the horizontal-arranged regions of oxide 126. Resulting from the anisotropic etch, drain-side oxide 128 and source-oxide 130 are formed. Note that contrary to the previous embodiments, sidewall spacers on both the source and drain sides are of equal thickness. Asymmetrical LDD regions can therefore be achieved not by varying the sidewall thicknesses, but also by employing a combination of LTA during LDD implant through, or preceeded by, a nitrided oxide as a diffusion barrier. FIG. 4g illustrates a relatively long LDD at the drain-side of the channel relative to the almost non-existence LDD at the source-side. The source/drain implant used in forming the p-channel device is performed at an angle substantially perpendicular to the upper horizontal surfaces, resulting in the source/drain implant regions 132.

It will be appreciated to those skilled in the art having the benefit of this disclosure that this invention is believed to be capable of forming any type of p-channel or n-channel transistor which derives a benefit in having an asymmetrical LDD structure. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for forming a p-channel transistor, comprising:

providing a silicon substrate having a source region and a drain region laterally spaced from each other by a gate conductor;

exposing said drain region, said source region and said gate conductor to a nitrogen and oxygen ambient to form a nitrided oxide;

implanting a first p-type dopant into said source region and said drain region at an angle within the range between 20° and 70° relative to upper surfaces of said source and drain regions;

depositing a source-side and a drain-side oxide upon said nitrided oxide;

removing said source-side and said drain-side oxide except for spacer portions of said source-side and said drain-side oxide immediately adjacent lateral portions of said nitrided oxide, said lateral portions being arranged immediately adjacent opposed sidewall surfaces of said gate conductor; and implanting a second p-type dopant into areas of said source region and said drain region laterally spaced from said gate conductor by said spacer portions of said source-side and said drain-side oxide and said lateral portions of said nitride oxide at an angle substantially perpendicular to upper surfaces of said source and drain regions.

2. The method as recited in claim 1, wherein said source region and said drain region comprise areas of said silicon substrate prior to first and second p-type dopant forwarded therein.

3. The method as recited in claim 1, wherein said first p-type dopant is implanted into said source and drain regions at a concentration less than the concentration at which said second p-type dopant is implanted.

4. The method as recited in claim 1, wherein said first and second p-type dopants each comprise an elemental species of boron.

5. The method as recited in claim 1, wherein said gate conductor is formed by the steps of:

depositing a layer of polycrystalline silicon upon a dielectric which resides directly upon said silicon substrate;

doping said layer of polycrystalline silicon; and removing portions of said layer of polycrystalline silicon.

6. The method of claim 1, wherein said implanting a first p-type dopant forms a source-side LDD area spaced from said gate conductor and a drain-side LDD region partially beneath said gate conductor.

7. The method of claim 1, wherein said spacer portions of said source-side and said drain-side oxide comprise substantially equivalent thicknesses.

8. The method of claim 1, wherein said removing comprises anisotropically etching said source-side and said drain-side oxide.

* * * * *